United States Patent
Arndt et al.

(10) Patent No.: US 7,466,150 B2
(45) Date of Patent: Dec. 16, 2008

(54) APPARATUS AND METHOD FOR GENERATING A POWER SIGNAL FROM A LOAD CURRENT

(75) Inventors: Christian Arndt, Munich (DE); Wolfgang Troeger, Munich (DE)

(73) Assignee: Infineon Technologies AG, Munich (DE)

( * ) Notice: Subject to any disclaimer, the term of this patent is extended or adjusted under 35 U.S.C. 154(b) by 130 days.

(21) Appl. No.: 11/536,766

(22) Filed: Sep. 29, 2006

(65) Prior Publication Data

US 2007/0080744 A1 Apr. 12, 2007

(30) Foreign Application Priority Data

Sep. 30, 2005 (DE) .................. 10 2005 046 993

(51) Int. Cl.
*G01R 27/08* (2006.01)
*G01R 31/327* (2006.01)

(52) U.S. Cl. ................ 324/713; 324/415; 324/416
(58) Field of Classification Search ........... 324/713, 324/415, 416, 765
See application file for complete search history.

(56) References Cited

U.S. PATENT DOCUMENTS 5,497,072 A * 3/1996 LeComte et al. ............ 323/289
5,723,915 A * 3/1998 Maher et al. ................ 307/131
6,011,413 A * 1/2000 Hayakawa et al. ............ 327/51
6,057,728 A 5/2000 Igarashi ...................... 327/546
7,151,462 B2 * 12/2006 Horn ........................ 324/76.11
7,372,685 B2 * 5/2008 Beck et al. .................. 361/93.1

FOREIGN PATENT DOCUMENTS

DE 19825211 C2 9/2001

* cited by examiner

*Primary Examiner*—Timothy J Dole
(74) *Attorney, Agent, or Firm*—Eschweiler & Associates, LLC

(57) ABSTRACT

An apparatus for generating a power signal from a load current is described, has a controller with a load current input, a load current output, an intermediate signal output, and a status signal output, an influencing device with an intermediate signal input and a power signal output, and an interruption device with an interrupt input, an interrupt output, and a status signal input. The controller generates a status signal and an intermediate signal depending on the load current, and the interruption device interrupts the power signal if the status signal satisfies a predetermined first condition, and otherwise lets the power signal pass, and the influencing device generates the intermediate signal as the power signal and output the same at the power signal output if the intermediate signal does not satisfy a predetermined second condition, and otherwise generates and output a power signal with a predetermined value.

23 Claims, 11 Drawing Sheets

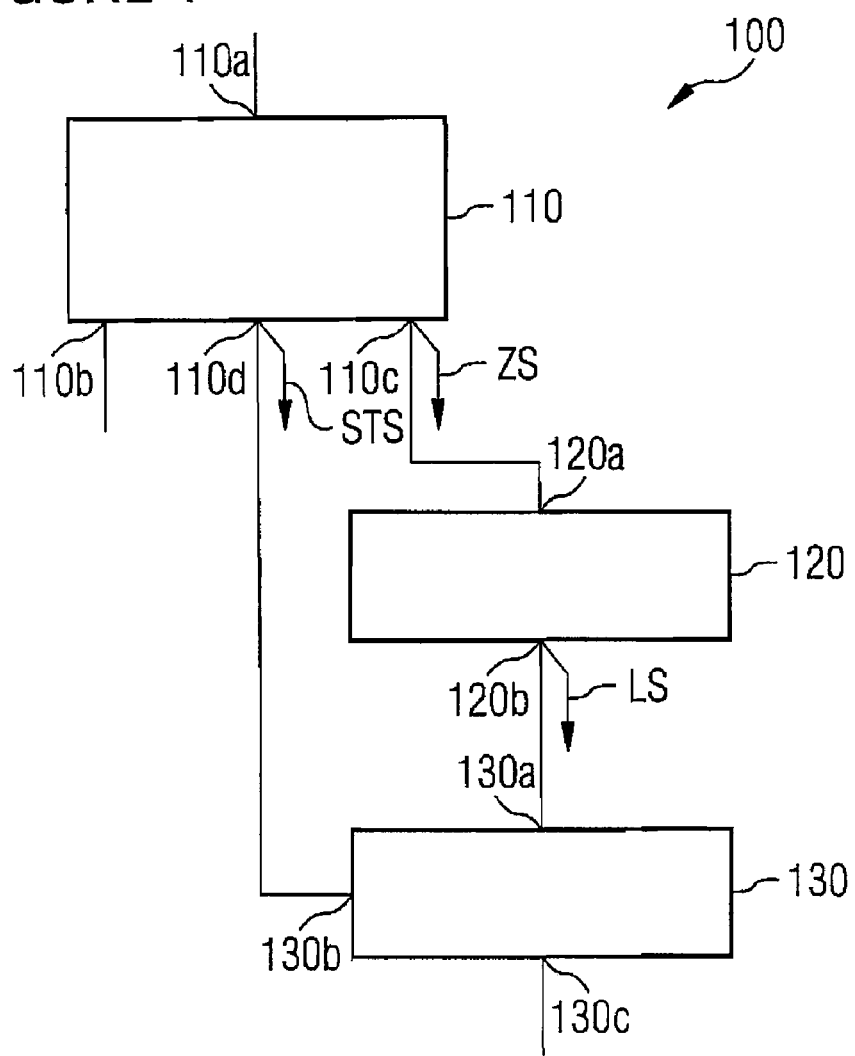

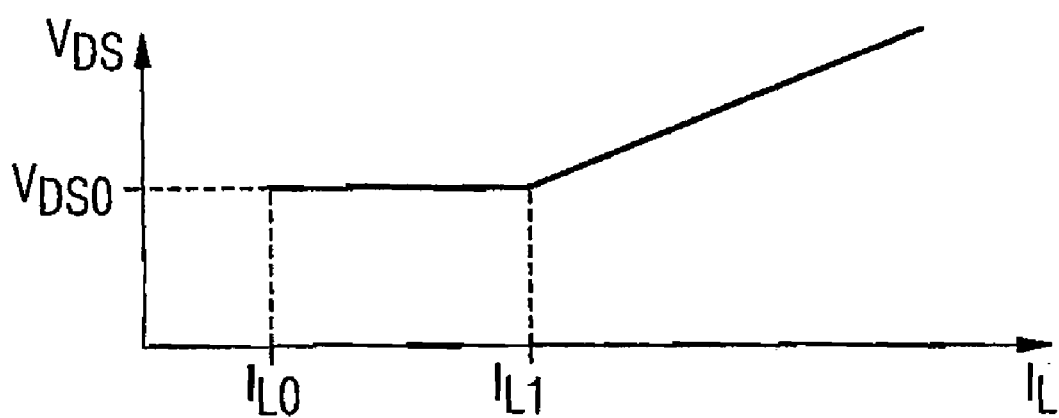
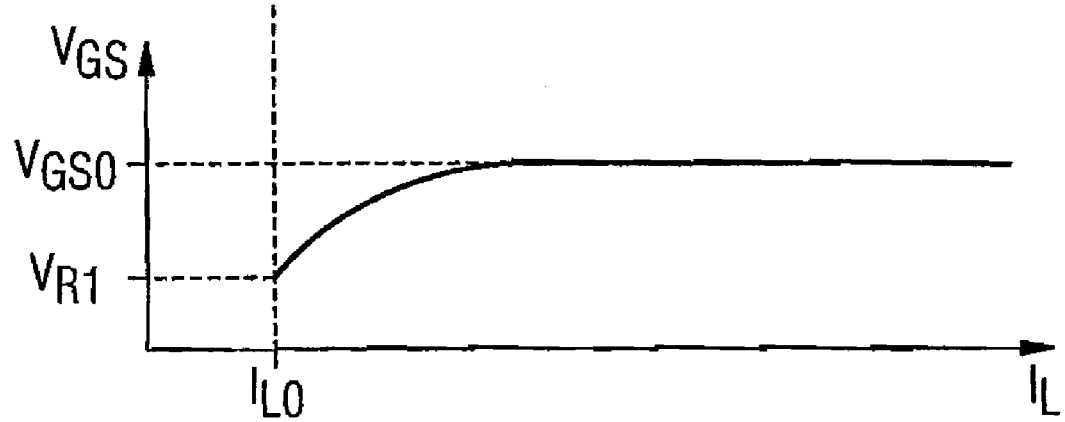

US 7,466,150 B2

APPARATUS AND METHOD FOR GENERATING A POWER SIGNAL FROM A LOAD CURRENT

CROSS-REFERENCE TO RELATED APPLICATIONS

This application claims priority from German Patent Application No. 102005046993.0, which was filed on Sep. 30, 2005, and is incorporated herein by reference in its entirety.

TECHNICAL FIELD

The present invention relates to an apparatus and a method for generating a power signal from a load current flowing through an external apparatus, and in particular to a semiconductor switch.

BACKGROUND

Today, the signal design of current-measuring or current-sensing semiconductor switches is usually based on a current-sensing behavior in the normal operation, in which a sense current proportional to a load current $I_L = I_{sense} \cdot K_{ILIS}$ is output, and a defined signal output in case of an occurring fault. In this case, a defined current or a defined voltage, for example an infinitesimal current or an infinitesimal voltage (value 0) or a maximum current or a maximum voltage, is output in case of a switch-off attributable to a fault state. In principle, this signal design permits a differentiation of the operating cases of load interruption (open load), in which the sense current or the sense voltage take on a sufficiently small value, normal operation, in which the sense current or the sense voltage is in a predetermined and monitored range, and the fault case, in which a defined sense current or a defined sense voltage is output, as explained above. This signal design, however, is optimized for semiconductor switches without open load diagnosis in the switched-on state (ON). FIG. 12 shows the presently common, principle designs of such a load signal.

FIG. 12 shows two schematic illustrations of an exemplary signal design of a voltage course $V_{IS}$ of a sense pin of a semiconductor switch as a function of a load current $I_L$ flowing through an external component, wherein a case in which a defined voltage is output is illustrated in FIG. 12a, and a defined current in the fault case in the case illustrated in FIG. 12b. In FIGS. 12a and 12b, a course of a $V_{IS}$-$I_L$ course each is schematically shown for a measuring resistor with the value $R_{IS\_1}$ 850-1 and 860-1 attached to the sense pin of the semiconductor switch and for an electrical resistor $R_{IS\_2}$ 850-2 and 860-2 smaller as compared to $R_{IS\_1}$. Here, the voltage $V_{IS}$ at the sense pin rises, starting from an infinitesimal load current ($I_L$=0), in substantially linear manner with the load current $I_L$ for all cases illustrated in FIG. 12, until the load current reaches and exceeds a predetermined maximum value $I_{L\_FAULT}$. From the load current $I_{L\_FAULT}$ on, a constant and predetermined voltage $V_{IS\_max}$ is provided at the sense pin of the semiconductor switch in the waveform illustrated in FIG. 12a, so that the constant voltage $V_{IS\_max}$ is present at the sense pin independently of the electrical resistor attached to the sense pin. In the waveform illustrated in FIG. 12b, upon reaching and exceeding the limit $I_{L\_FAULT}$ by the load current $I_L$, a constant current, which leads to a corresponding voltage signal $V_{IS}$ at the sense pin of the semiconductor switch, depending on present electrical resistance, is output at the sense pin.

Moreover, FIG. 12 schematically shows three load current regions, namely an open load load current region 870-2, a normal operation load current region 870-4, and a fault case load current region 870-6. Due to the jump that sets in when exceeding the load current threshold $I_{L\_FAULT}$ of the $V_{IS}$-$I_L$ characteristic curves 850-1, 850-2, 860-1, 860-2, only the error case load current region 870-6 out of these three load current regions is uniquely identifiable. Particularly in the range of small load currents, a unique differentiation of the load current regions open load 870-2 and the normal operation load current region 870-4 hardly is possible, since the voltage $V_{IS}$ present at the sense pin of the semiconductor switch depends on the resistor attached to this pin on the one hand, and the voltages $V_{IS}$ resulting in these load current regions frequently lie in the range of zero point voltages or also noise amplitudes of typical semiconducting devices in typical applications, for example in the motor vehicle field.

In other words, this signal design is not or not optimally applicable to semiconductor circuits with an open load diagnosis in the switched-on state, as for example described in the non-published German patent application DE 10 2005 030 150.9.

SUMMARY

According to an embodiment, an apparatus for generating a power signal from a load current flowing through an external apparatus, may have: a controller with a load current input for the load current, a load current output for the load current, an intermediate signal output for an intermediate signal, and a status signal output for a status signal; an influencer with an intermediate signal input for the intermediate signal and a power signal output for the power signal; and an interrupter with an interruption input for the power signal, an interruption output for the power signal, and a status signal input for the status signal, wherein the controller is formed to generate the status signal and the intermediate signal, depending on the load current; wherein the interrupter is formed to interrupt the power signal if the status signal satisfies a predetermined first condition, and otherwise let the power signal pass; and wherein the influencer is formed to output the intermediate signal as the power signal at the power signal output if the intermediate signal does not satisfy a predetermined second condition, and otherwise generate and output the power signal with a predetermined value, or is formed so as to output the intermediate signal as the power signal at the power signal output if the load current does not satisfy a predetermined second condition, and otherwise generate and output the power signal with the predetermined value.

BRIEF DESCRIPTION OF THE DRAWINGS

These and other objects and features of the present invention will become clear from the following description taken in conjunction with the accompanying drawings, in which:

FIG. 1 is a block circuit diagram of an apparatus for generating a power signal from a load current;

FIG. 6 is a schematic illustration of waveforms of the gate back regulation circuit;

DETAILED DESCRIPTION

Figure 2A:
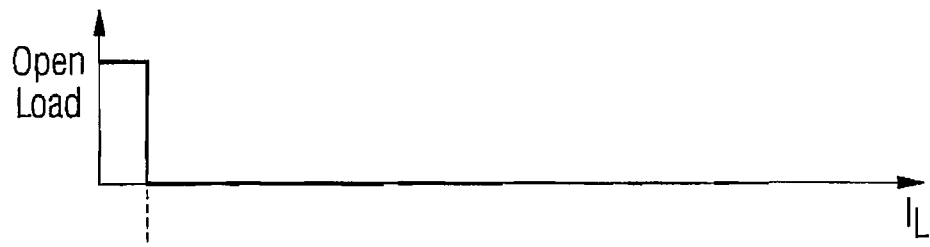
FIG. 2 is a schematic illustration of a signal design of the power signal, depending on the load current, according to an embodiment.

According to another embodiment, a method for generating a power signal from a load current flowing through an external apparatus may have the steps of: generating a status signal and an intermediate signal, depending on the load current; outputting the intermediate signal as the power signal if the intermediate signal does not satisfy a predetermined second condition, otherwise generating and outputting the power signal with a predetermined value, or outputting the intermediate signal as the power signal if the load current does not satisfy a predetermined second condition, otherwise generating and outputting the power signal with a predetermined value; and interrupting the power signal if the status signal satisfies a predetermined first condition, and otherwise letting the power signal pass.

According to another embodiment, a computer program with a program code for performing, when the computer program is executed on a computer, a method for generating a power signal from a load current flowing through an external apparatus may comprise the steps of: generating a status signal and an intermediate signal, depending on the load current; outputting the intermediate signal as the power signal if the intermediate signal does not satisfy a predetermined second condition, otherwise generating and outputting the power signal with a predetermined value, or outputting the intermediate signal as the power signal if the load current does not satisfy a predetermined second condition, otherwise generating and outputting the power signal with a predetermined value; and interrupting the power signal if the status signal satisfies a predetermined first condition, and otherwise letting the power signal pass.

The apparatus for generating a power signal from a load current flowing through an external apparatus may comprise a control means with a load current input for the load current, a load current output for the load current, an intermediate signal output for an intermediate signal, and a status signal output for a status signal, an influencing means with an intermediate signal input for the intermediate signal and a power signal output for the power signal, and an interruption means with an interruption input for the power signal, an interruption output for the power signal, and a status signal input for the status signal, wherein the control means can be formed to generate the status signal and the intermediate signal depending on the load current, wherein the interruption means can be formed to interrupt the power signal if the status signal satisfies a predetermined first condition, and otherwise let the power signal pass, and wherein the influencing means can be formed to output the intermediate signal as the power signal at the power signal output if the intermediate signal does not satisfy a predetermined second condition, and otherwise generate and output the power signal with a predetermined value, or formed to output the intermediate signal as the power signal at the power signal output if the load current does not satisfy a predetermined second condition, and otherwise generate and output the power signal with the predetermined value.

The method for generating a power signal from a load current flowing through an external apparatus may include a step of generating a status signal and an intermediate signal depending on the load current, outputting the intermediate signal as the power signal if the intermediate signal does not satisfy a predetermined second condition, otherwise generating and outputting the power signal with a predetermined value, or outputting the intermediate signal as the power signal if the load current does not satisfy a predetermined second condition, otherwise generating and outputting the power signal with a predetermined value, and interrupting the power signal if the status signal satisfies a predetermined first condition, and otherwise letting the power signal pass.

A unique discrimination of the operating states, and hence the load current regions of "load interruption in the switched-on state", normal operation and fault state, can be enabled by a power signal having a corresponding signal design and thus enabling additional functionality of the possibility of discrimination of the mentioned operating states. A further advantage of introducing the load signal with such a signal design permitting the unique discrimination of the operating cases previously mentioned is that additional control terminals and/or status terminals making the additional information available to further parts of a possible circuit are not required. Apart from a reduction in the manufacturing costs of corresponding circuits, such a design also enables downward compatibility to semiconductor switches already available.

Thus, the signal design explained in the further course of the present application enables unique discrimination of the operating states of load interruption in the switched-on state (open load when ON), current measurement in a normal state of operation, wherein the load current lies in a range intended for an application (applicative range) and may be determined via the power signal (sense), and a fault state. For example, such a fault state may occur when the external apparatus or the external device is operated at extreme overload so that it has switched off due to over-temperature or a short or other switching-off or protective mechanisms have been activated. A substantial advantage of the signal design described here is, apart from the possibility of discrimination of the operating cases mentioned previously, that maximum possible resolution of the load current may be achieved in the normal operation. In particular, this can be advantageous in the evaluation of the power signal or current sense signal via an analog input of a microcontroller, for example. The signal design may in this case be optimized to different parameters and resolutions of analog/digital converters via corresponding design measures. A focus of the signal design of the present application here lies on the discrimination between the normal operating state in the lower load current region and a load current interruption in the switched-on state (open load when ON).

With reference to FIGS. 1-11, a first embodiment for the generation of a power signal from a load current will now be described. In the further course, the same reference numerals or derived reference numerals will be used for the same or similar objects.

FIG. 1 shows a block circuit diagram of an apparatus 100 for generating a power signal from a load current according to an embodiment. The apparatus 100 comprises a control means 110 with a load current input 110a, a load current output 110b, an intermediate signal output 110c, and a status signal output 110d. At its intermediate signal output 110c, the control means 110 makes available an intermediate signal ZS, which depends on a load current flowing into the control means 110 at its load current input 110a and flowing out at the load current output 110b. Moreover, at its status signal output 110d, the control means 110 makes a status signal STS available. An intermediate signal input 120a of an influencing means 120 is attached at the intermediate signal output 110c of the control means 110. The influencing means 120 now makes a power signal LS available at a power signal output 120b, depending on the intermediate signal ZS or the load current. Here, the influencing means 120 typically outputs the intermediate signal ZS as the power signal LS if the ZS or the load current does not satisfy a predetermined second condition, and outputs a predetermined, preferably constant value as power signal if the predetermined second condition is satisfied by the intermediate signal ZS or the load current. The power signal output 120b of the influencing means 120 is further connected to an interruption input 130a of an interruption means 130. Moreover, the interruption means comprises a status signal input 130b and an interruption output 130c. The status signal input 130b is connected to the status signal output 110d of the control means 110. The interruption means 130 here typically interrupts the power signal LS if the status signal STS satisfies a predetermined first condition, and otherwise lets it pass. Typically, the intermediate signal ZS or the load current satisfies the second condition if the status signal STS satisfies the first condition. In other words, the status signal STS typically can only satisfy the first condition if the intermediate signal ZS or the load current satisfies the second condition. Thus, the case of the status signal STS satisfying the first condition, the intermediate signal ZS or the load current not satisfying the second condition, typically cannot occur.

Figure 2B:
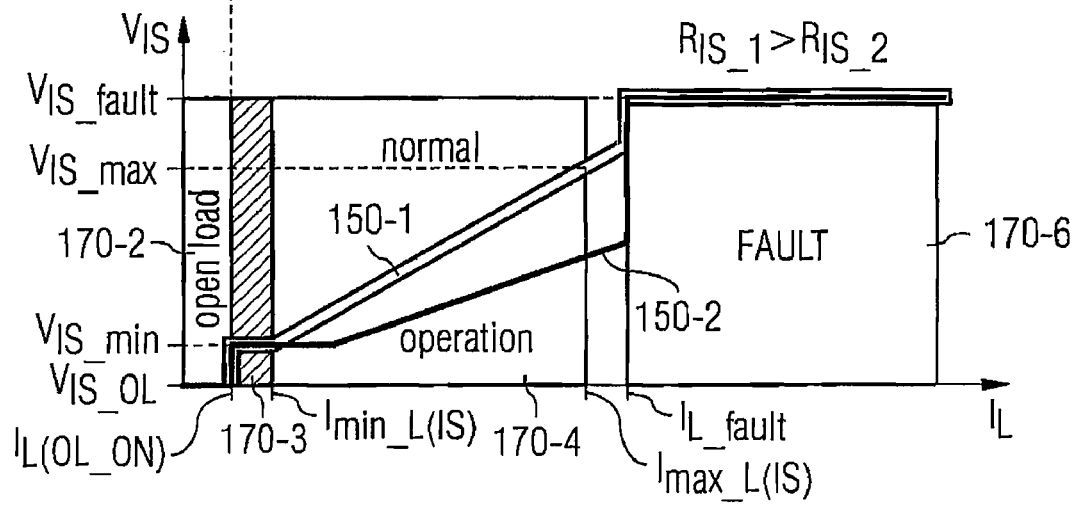

The functioning of the individual components of the apparatus 100 generating a power signal will now be described in greater detail on the basis of FIGS. 2 and 3. FIG. 2 shows a schematic illustration of an example of a signal design of the load signal LS, depending on the load current $I_L$, wherein the power signal LS is a voltage signal $V_{IS}$ in the present case. FIG. 2a thus shows a state of a load interruption (open load), depending on the load current $I_L$, wherein FIG. 2b shows two $V_{IS}$-$I_L$ courses 150-1 and 150-2 for two different values $R_{IS\_1}$, $R_{IS\_2}$ of a resistor attached at the interruption output 130c of the interruption means 130, but not shown in FIG. 1. Here, the value $R_{IS\_1}$ of the electric resistor belonging to the waveform 150-1 is greater than the value $R_{IS\_2}$ of the electric resistor belonging to the waveform 150-2. The exemplary waveforms shown in FIG. 2 are based on a current as an intermediate signal ZS, which current is turned into a voltage signal $V_{IS}$ representing the actual power signal LS in the present example in the influencing means 120 by the measuring resistor not shown in FIG. 1. In the example shown in FIG. 2, in the fault case as well as in the case of the occurrence of a load interruption in the switched-on state (open load when ON), a constant voltage is output as power signal at the power signal output 120b of the influencing means. Thus, FIG. 2 shows a principle signal design at the example of a "current sense" with defined voltage signal in the fault case and in the open load case.

Moreover, an open load load current region 170-2, an intermediate load current region 170-3, a normal operation load current region 170-4, and a fault case load current region 170-6 are shown in FIG. 2b. Starting from a load current value $I_{max\_L(IS)}$ belonging to a voltage value $V_{IS\_max}$ with reference to the waveform 150-1, the voltage signal $V_{IS}$ increases with rising load current, until the voltage signal $V_{IS}$ is set to a constant predetermined value $V_{IS\_FAULT}$ on reaching a load current value $I_{L\_FAULT}$, i.e. on reaching the fault case load current region 170-6, by a circuit not included in FIG. 1. The waveform 150-2 belonging to the smaller-magnitude measuring resistor $R_{IS\_2}$ also comprises a jump to the value $V_{IS\_fault}$ on reaching and exceeding the load current $I_{L\_FAULT}$.

A fault case in the driven state thus is signaled by a defined voltage $V_{IS\_FAULT}$ or by a defined current $I_{S\_fault}$ by analogy with the concepts mentioned in the introductory sections of the present application. By analogy with the present-day concepts for semiconductor switches with normal current measuring functionality, either a defined fault voltage, for example $V_{IS\_fault}$=5 volts, or a defined fault current $I_{IS\_fault}$=5 mA is output via output of the semiconductor switch (sense) in the overload fault case.

Starting from a load current value $I_{max\_L(IS)}$, i.e. starting from the greatest load current value belonging to the normal operation load current region 170-4, the power signal $V_{IS}$ decreases with falling load current $I_L$ as far as until the power signal $V_{IS}$ has a minimum value $V_{IS\_min}$ in the present example. In the case of the waveform 150-1 shown in FIG. 2b, this occurs at a load current value $I_{min\_L(IS)}$, i.e. at a minimum load current value of the normal operation load current region 170-4. By analogy with the present-day concepts for semiconductor switches with normal current measuring functionality (current sense functionality), a defined measuring current (sense current) or also a defined measuring voltage (sense voltage), which is proportional to the load current $I_L$ in the normal operation load current region 170-4, i.e. in the load current region $I_{min\_L(IS)} \leq I_L \leq I_{max\_L(IS)}$, in the normal operation. The dividing ratio or the proportionality constant here results from the parameter $K_{ILIS}=I_L/I_S$, or $K'_{ILIS}=I_L/V_{IS}$ in case of a voltage signal.

In the intermediate load current region 170-3, i.e. in a load current region between the load current value $I_{min\_L(IS)}$ and a value $I_{L(OL\_ON)}$, the power signal $V_{IS}$ is fixed or clamped to the constant voltage value $V_{IS\_min}$. In the open load load current region 170-2 adjoining the intermediate load current region 170-3 toward smaller load currents, i.e. when falling below a value $I_{L(OL\_ON)}$ by the load current $I_L$, the power signal $V_{IS}$ is fixed to a value $V_{IS\_OL}$ mostly corresponding to a voltage of about 0 volts by the interruption means 130 in the example shown in FIG. 2. The interruption means 130 thus separates the power signal and thus provides for an easily detectable jump of the power signal $V_{IS}$.

On the one hand, the monitoring of the normal operation load current region 170-4 between a minimum value $I_{min\_L(IS)}$ and a maximum value $I_{max\_L(IS)}$ is now possible with this signal design. Via the power signal (sense signal), however, a clear undershoot of the adjusted load interruption threshold (open load when ON threshold) by the load current at a value $I_{L(OL\_ON)}$ now is recognizable by outputting a defined voltage or a defined current in the intermediate load current region 170-3, i.e. below the normal operation load current region 170-4 (load current monitoring region) and above the open load when ON threshold ($I_{L(OL\_ON)} \leq I_L \leq I_{min\_L(IS)}$), and by the output sense voltage or the output sense current dropping to zero only upon falling below the open load threshold. Only in the load current region with values smaller than $I_{L(OL\_ON)}$, i.e. in the open load load current region 170-2, is there a load interruption, as this is also shown in FIG. 2a. FIG. 3 shows this particular functioning in the lower load current region once again in highlighted manner, wherein the voltage value $V_{IS\_OL}$ caused by the interruption means 130 is entered with the value 0 on the $V_{IS}$ axis.

Figure 3A:
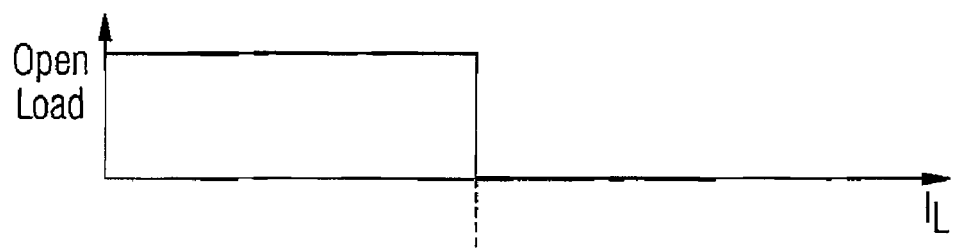
FIG. 3 is a schematic illustration of a signal design of the power signal, depending on the load current in the lower load current region, according to an embodiment.
Figure 3B:
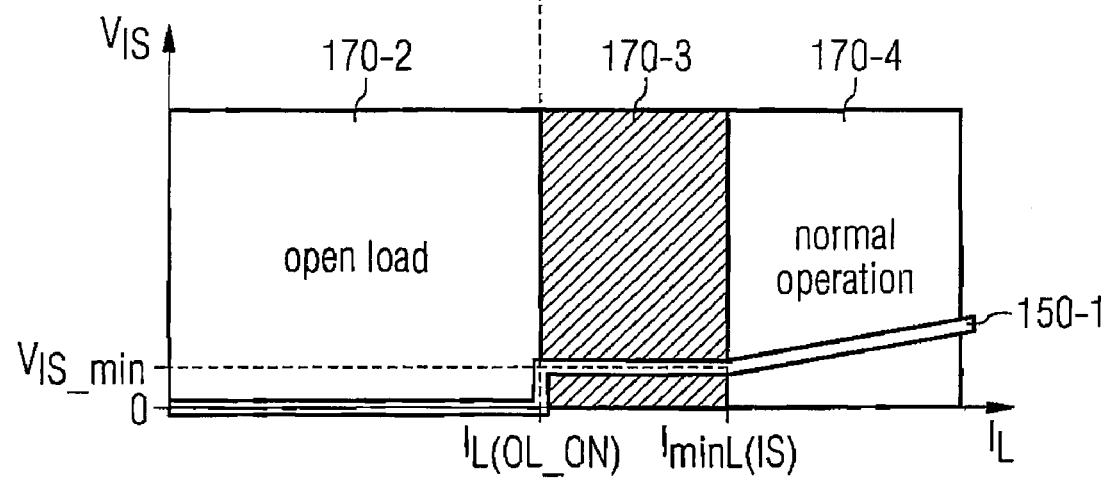
Figure 4A:
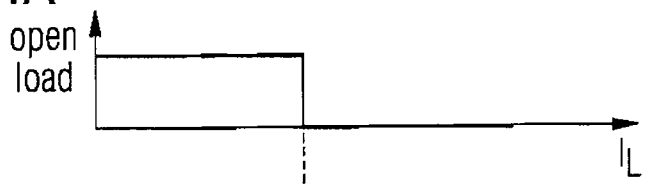
FIG. 4 is a schematic illustration of a signal design of the power signal, depending on the load current for various threshold criteria, according to an embodiment.
Figure 4B:
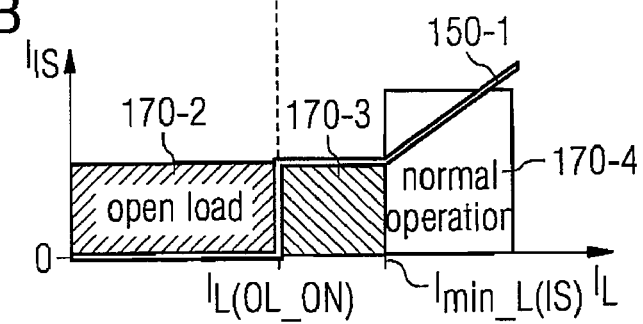
Figure 4C:
Figure 4D:
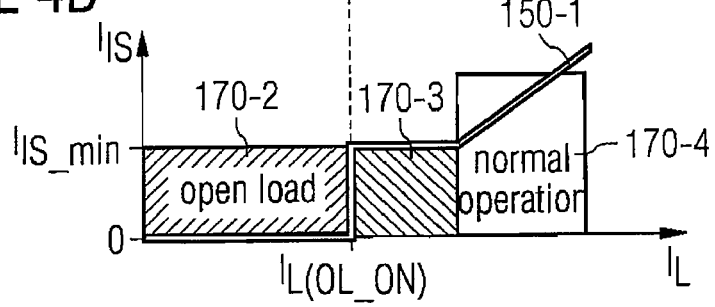
Figure 4E:
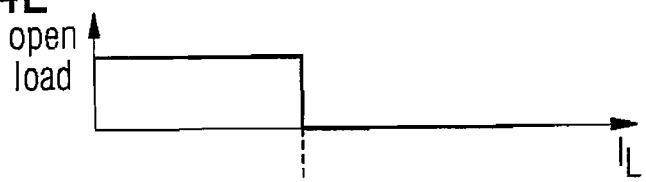
Figure 4F:
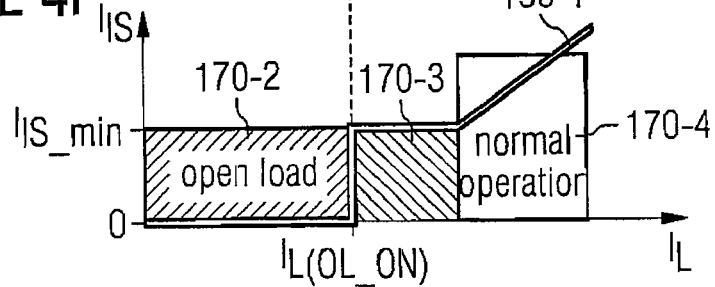

The signal design described, i.e. particularly the signal design of a sense voltage as power signal on the basis of a current as intermediate signal for a switch with open load recognition when ON shown in FIGS. 2 and 3, aims at making the load current available in the normal operation with a maximum possible resolution of the evaluating component, i.e. for example an analog/digital converter of a microcontroller, in switches with open load diagnosis when ON. The present signal design thus permits, apart from the mere discrimination of the operating states of open load when ON, normal operation and fault case, to achieve maximum resolution of the load current in the normal operation. The specific signal design may here be optimized to different parameters and resolutions of analog/digital converters, as a microcontroller may comprise at an analog input, via corresponding design measures.

Typical parameters and resolutions of microcontrollers typically lie at 3.3 volts or 5 volts at a resolution of 8, 10 or 12 bits. The occurrence of a load interruption in the switched-on state (open load when ON) is signaled just as uniquely as an occurrence of a fault by the sense signal $V_{IS}$ dropping to zero from a defined voltage $V_{IS\_min}$ or from a defined sense current $I_{IS\_min}$ on falling below the open load threshold of the load current $I_L$. The defined voltage or the defined current is chosen so that still sufficient determination (sensing) via an analog input of the microcontroller is possible. In the case of a microcontroller with an operating voltage of 5 volts and an analog/digital converter with a resolution of 8 bits and a four-bit criterion, for example, a minimum value $V_{IS\_min}=5$ volts*4/256≈78 mV results.

The prerequisite for this is that the current measuring functionality to the outside, i.e. with reference to a circuit into which the apparatus 100 is integrated or implemented, is "deactivated" in the lower load current region, i.e. at load currents $I_L \leq I_{min\_L(IS)}$, or alternatively in the lower sense voltage region, i.e. in the region of $V_{IS(theoretical)}=R_{IS} \cdot I_L / K_{ILIS} < V_{IS\_min}$. Since in switches with a load interruption diagnosis in the switched-on state (open load when ON) the open load threshold can be set to considerably smaller load current values than in switches with normal current measuring functionality, the signal design indicated here offers the advantage that the current measuring functionality works like in switches with a normal current measuring functionality at comparable load current regions. In spite of that, clear differentiation of a load interruption as compared with a load non-interruption is possible. This is achieved by the output power signal (sense signal) remaining clamped to a lower "stop", which may be a current value $I_{IS\_min}$ or a voltage value $V_{IS\_min}$ at load currents greater than the open load threshold $I_{L(OL\_ON)}$. Only when falling below the open load threshold within the scope of the open load diagnosis when ON, does the output sense voltage or the output sense current drop to zero.

Apart from the possibility shown in FIGS. 2 and 3 of using a sense voltage $V_{IS}$ as power signal, depending on the load current $I_L$, FIG. 4 shows three further waveforms in the lower load current region. Here, FIG. 4b shows the "clamping" of the sense current $I_{IS}$ as a power signal from a minimum load current $I_{min\_L(IS)}$ on, wherein FIG. 4a shows the accompanying course of the load interruption. Correspondingly, FIG. 4d shows the "clamping" of the sense current $I_{IS}$ from a minimum sense current $I_{IS\_min}$ on, with the accompanying load interruption course in FIG. 4c. Finally, FIG. 4f shows the "clamping" of the sense voltage $V_{IS}$ as a power signal from a minimum sense voltage $V_{IS\_min}$ on, with the accompanying load interruption course illustrated in FIG. 4e.

As illustrated in FIG. 4, the output sense current $I_{IS}$ or the output sense voltage $V_{IS}$ is "clamped" or fixed to a defined value as long as $I_L > I_{L(ON\_ON)}$ applies, for the discrimination of a load interruption in the switched-on state (open load when ON) as opposed to the absence of a load interruption either at too small a load current ($I_L \leq I_{min\_L(IS)}$), at a correspondingly too low sense current ($I_{IS(theoretical)} \leq I_{IS\_min}$), or alternatively at too small a sense voltage ($V_{IS(theoretical)} \leq V_{IS\_min}$). The minimum sense current $I_{IS\_min}$ thus defined or the sense voltage $V_{IS\_min}$ thus defined is provided by the internal logic of the switch until the load current $I_{L(OL\_ON)}$ falls below the open load threshold. In this case, i.e. as soon as the load current $I_L$ falls below the threshold of the load interruption in the switched-on state (open load when ON), the output voltage or the output current as a power signal drops to zero at the power signal output 130c (sense) due to the intervention of the interruption means 130. As already mentioned, FIG. 4 shows the corresponding signal design in the region of low load currents again for the cases of too small a load current, too small a sense current, and too small a sense voltage.

In other words, the present application describes, based on the unpublished German patent application DE 10 2005 030 150.9, the signal behavior of a smart switch with load interruption recognition in the switched-on state (open load when ON), which enables to achieve a unique discrimination of the operating cases of load interruption in the switched-on state, current measurement (current sensing) in the normal operation, and switching off in the fault case.

In the following sections, embodiments will be shown in form of circuit diagrams and block circuit diagrams of the apparatus according to an embodiment. More particularly, they are circuit-technology implementations including circuit units for the recognition of a load interruption in the switched-on state (open load when ON), for example. The embodiments shown are high-side switches with internal current measurement (current sense), automatic activation of the current interruption recognition in the switched-on state, internal automatic open load when ON activation, and an open load threshold adjustable via an external resistor $R_{OL}$. In general and within the scope of the present application, a switch connected between a load and voltage source or a current source so that the switch is connected to a terminal of the voltage source or current source lying at a higher potential as opposed to a second terminal of the current source or voltage source is understood by a high-side switch. Correspondingly, a switch connected between a load and a voltage source or a current source so that the switch is connected to the terminal of the voltage source or the current source lying at the lower potential as opposed to the second terminal of the voltage source or the current source is understood by a low-side switch.

In the further course of the present application, however, the main focus is on the lower load current region. The functionality of a detection of a fault case by outputting a constant voltage or a constant current in the case of very high load currents explained in connection with FIG. 2 is not included in the embodiment shown in FIG. 5. In other words, the main focus of the present application is on a signal design of the current sense for open load when ON switches.

Figure 5:
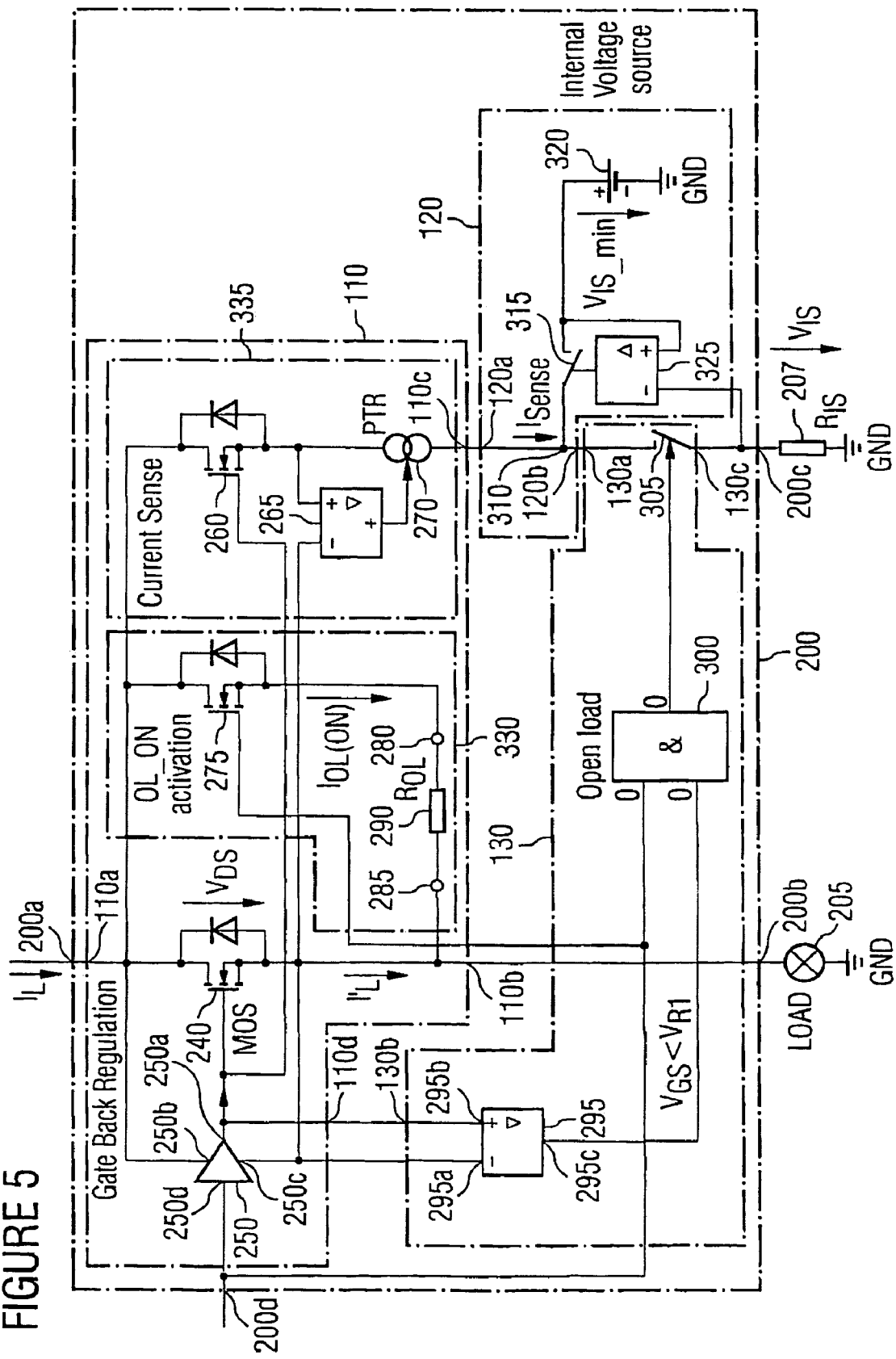
FIG. 5 is a block circuit diagram of a first embodiment.

FIG. 5 shows a first embodiment of an apparatus for generating a power signal from a load current flowing through an external apparatus, which is embodied as a high-side switch 200 in the present embodiment. The high-side switch 200 comprises a first terminal 200a for a load current $I_L$ and a second terminal 200b for the load current $I_L$. The first terminal 200a of the high-side switch 200 here represents an input for the load current $I_L$ and the second terminal 200b of the high-side switch an output for the load current $I_L$, which is connected to a load 205, shown in FIG. 5, and also to a reference potential GND. Moreover, the high-side switch 200 comprises a third terminal 200c as an output for a power signal $V_{IS}$ and a control signal input 200d for a control signal. The control signal input 200d of the high-side switch 200 serves for switching on the load current $I_L$ on the one hand and for concurrently activating the open load recognition on the other hand. The high-side switch 200 further includes a control means 110 with a load current input 110a corresponding to the first terminal 200a of the high-side switch 200, a load current output 110b connected to the second terminal 200b of the high-side switch 200, an intermediate signal output 110c, and a status signal output 110d.

Moreover, the high-side switch 200 includes an influencing means 120 with an intermediate signal input 120a connected to the intermediate signal output 110c, as already shown in FIG. 1, and a power signal output 120b. Furthermore, the high-side switch 200 comprises an interruption unit 130 with an interruption input 130a connected to the power signal output 120b, a status signal input 130b coupled to the status signal output 110d, and an interruption output 130c connected to the third terminal 200c of the high-side switch 200. The third terminal 200c of the high-side switch 200 is connected to a measuring resistor 207 with a resistance $R_{IS}$ and to the reference potential GND. Thus, the voltage $V_{IS}$ output as power signal from the high-side switch 200 drops across the measuring resistor 207.

The control means 110 comprises a first field-effect transistor 240 embodied as enhancement n-channel MOSFET with freewheeling diode and also referred to as MOS in FIG. 5. A drain terminal of the first field-effect transistor 240 is connected to the load current input 110a, and a source terminal of the first field-effect transistor 240 to the load current output 110b. A gate terminal of the first field-effect transistor 240 is connected to an output 250a of a gate back or feedback regulation circuit 250, the construction and functioning of which will be described and explained in the further course of the present application and in connection with FIG. 7. Apart from the output 250a, the gate back regulation circuit 250 comprises a drain potential terminal 250b, a source potential terminal 250c, and a control input 250d. The control input 250d is connected to the control signal input 200d of the high-side switch 200, whereas the drain potential terminal 250b is coupled to the drain terminal of the first field-effect transistor 240, and the source potential terminal 250c to the source terminal of the first field-effect transistor 240.

Apart from the first field-effect transistor 240, the control means 110 comprises a second field-effect transistor 260, which is also formed as an enhancement n-channel MOSFET with freewheeling diode in the present embodiment. A drain terminal of the second field-effect transistor 260 is also connected to the load current input 110a, and hence to the drain terminal of the first field-effect transistor 240. A gate terminal of the second field-effect transistor is also coupled to the output 250a of the gate back regulation circuit. A source terminal of the second field-effect transistor 260 is connected to a non-inverting input of an operational amplifier 265. An inverting input of the operational amplifier 265 is connected to the source terminal of the first field-effect transistor 240. A source terminal of the second field-effect transistor 260 is connected to a first terminal of a controllable current source 270, which is attached to the intermediate signal output 110c of the control means 110 with a second terminal and coupled to the output of the operational amplifier 265 with a control input. The controllable current source 270 may here for example be embodied as a transistor, typically as a field-effect transistor, and particularly as an enhancement n-channel MOSFET. The designation PTR (power transistor) included in FIG. 5 also indicates this design. In the case of an enhancement n-channel MOSFET, a drain terminal corresponds to the first terminal of the controllable current source 270, a source terminal to the second terminal, and a gate terminal to the control terminal.

Furthermore, the control means 110 comprises a third field-effect transistor 275, which is also embodied as an enhancement n-channel MOSFET with freewheeling diode, like the first field-effect transistor 240 and the second field-effect transistor 260, in the present embodiment. A drain terminal of the third field-effect transistor is also attached to the load current input 110a of the control means 110. A source terminal of the third field-effect transistor 275 is attached to a first external terminal 280 and a gate terminal of the third field-effect transistor to the control input 200d of the high-side switch 200. A second external terminal 285 is attached to the source terminal of the first field-effect transistor 240.

An external resistor 290 with a resistance $R_{OL}$ for fixing the open load threshold is connected between the first external terminal 280 and the second external terminal 285. The interruption means 130 comprises a comparison circuit 295, the possible construction and functioning of which will be described and explained in greater detail in the further course of the present application and in connection with FIG. 8, with a first input 295a, a second input 295b, and an output 295c. The first input 295a of the comparison circuit 295 is connected to the source terminal of the first field-effect transistor 240, the second input 295b of the comparison circuit 295 to the status signal input 130b of the interruption means 130, i.e. ultimately to the output 250a of the gate back regulation circuit 250. The output 295c of the comparison circuit 295 is connected to a first terminal of an AND gate 300 also comprising the interruption means 130. A second input of the AND gate 300 is connected to the control signal input 200d of the high-side switch 200. An output of the AND gate 300 is coupled to a control input of a first switch circuit 305. The first switch circuit 305 further comprises a first terminal connected to the interruption input 130a of the interruption means 130, and a second terminal connected to the interruption output 130c of the interruption means 130. The first switch circuit 305 may for example be embodied as a transistor, typically as a field-effect transistor, and particularly as an enhancement n-channel MOSFET. In the case of an enhancement n-channel MOSFET, the control input of the first switch circuit 305 corresponds to a gate terminal, the first terminal to a drain terminal, and the second terminal to a source terminal. In this case, the n-channel MOSFET is switched in fully conducting manner when it is driven with a voltage signal corresponding to a logic high at its gate terminal, i.e. when $V_{IS\_min}$>$V_{IS}$ applies due to the connection of the comparator 325.

The influencing means 120 comprises a node 310 connected between the intermediate signal input 120a and the power signal output 120b of the influencing means 120. Furthermore, the node 310 is connected to a fist terminal of a second switch circuit 315. A second terminal of the second switch circuit 315 is connected to a first terminal of an internal voltage source 320, which lies at a higher potential as opposed to a second terminal of the internal voltage source 320 by the voltage $V_{IS\_min}$, and the second terminal of the internal voltage source 320 is connected to the reference potential GND. The influencing means 120 also comprises a comparator 325 with a non-inverting input attached at the first terminal of the internal voltage source 320, an inverting input connected to the third terminal 200c of the high-side switch 200, and an output attached to the control input of the second switch circuit 315 so that, when the potential at the inverting input of the comparator 325 exceeds the potential of the first terminal of the internal voltage source 320, the second switch circuit 315 interrupts the connection between the first terminal and the second terminal of the second switch circuit.

In order to explain the basic functioning of the high-side switch 200, it is necessary to explain the behavior of the gate back regulation circuit 250 in the context of the embodiment of the high-side switch 200 shown in FIG. 5. The behavior of the gate back regulation circuit 250 will therefore at first be explained on the basis of FIG. 6, before taking a closer look at the functioning and the behavior of the high-side switch 200. Following this, on the basis of FIGS. 7 and 8, a possible embodiment of the gate back regulation circuit 250 and of the comparison circuit 295 will be described an explained.

In FIG. 6, a load path voltage $V_{DS}$ of the first field-effect transistor 240, i.e. the voltage present between the drain terminal and the source terminal of the first field-effect transistor 240, as it is also drawn and designated in FIG. 5, and a drive voltage $V_{GS}$ of the first field-effect transistor, i.e. a voltage present between the gate terminal and the source terminal of the first field-effect transistor 240, are illustrated below each other depending on the load current $I_L$ flowing through the high-side switch. In FIG. 6, particularly the lower load current region is illustrated. For explanation, at first a switching state of the first field-effect transistor 240 is to be considered, in which the load current $I_L$ is greater than a lower threshold value $I_{L1}$, and in which the drive voltage $V_{GS}$ has a value $V_{GS0}$ at which the first field-effect transistor 240 is driven in completely conducting manner. The first field-effect transistor 240 in this case comprises a switch-on resistance $R_{ON}$, which takes on a minimum value in this switching state and is constant approximately independently of the load current $I_L$ flowing through the high-side switch 200, so that the load path voltage $V_{DS}$ increases proportionally to the flowing load current $I_L$, as shown in FIG. 6a. If the load path voltage $V_{DS}$ decreases to a lower threshold value, which is synonymous with the load current $I_L$ having decreased to a lower threshold value $I_{L1}$, the gate back regulation circuit 250 reduces the drive voltage $V_{GS}$ such as to close the first field-effect transistor 240 and thereby increase the switch-on resistance $R_{on}$ for small load current values, so that the load path voltage $V_{DS}$ is confined to the lower threshold value $V_{DS1}$ for small load current values. The drive voltage $V_{GS}$ here decreases from its original value $V_{GS0}$ to a value $V_{R1}$ with decreasing load current $I_L$ on reaching a load current $I_{L0}$, as this is shown in FIG. 6b.

Since the first field-effect transistor is embodied as an enhancement n-channel MOSFET in the embodiment of a high-side switch 200 shown in FIG. 5, the gate back regulation circuit reduces the drive voltage $V_{GS}$ to decreasing load currents $I_L$ when the load current $I_L$ falls below the load current threshold $I_{L1}$. When the drive voltage $V_{GS}$ falls below a predetermined driving threshold $V_{R1}$, the first switch circuit 305 is activated by the comparison circuit 295, wherein the switch circuit interrupts the power signal, i.e. in the present case the voltage $V_{JS}$ at the third terminal 200c of the high-side switch 200, or lets it drop to zero due to the coupling of the third terminal 200c of the high-side switch 200 to the reference potential GND. The drive voltage $V_{GS}$ here falls below the drive threshold $V_{R1}$ at a load current value $I_{L0}$, as this is shown in FIG. 6. The load current value $I_{L0}$ is decisively determined by the design of the external resistor 290 with the resistance $R_{OL}$ here, which is included by an open load activation circuit block 330 (OL_ON activation), along with the third field-effect transistor 275, the first external terminal 280, and the second external terminal 285. The load current $I_L$ is distributed to the two accompanying circuit branches due to the parallel connection of the first field-effect transistor 240 and the third field-effect transistor 275, wherein a load current portion $I'_L$ passes the source terminal and the drain terminal of the first field-effect transistor 240 and a load current portion $I_{OL(ON)}$ the source terminal and the drain terminal of the third field-effect transistor 275.

While the gate terminal of the first field-effect transistor 240 is connected to the output of the gate back regulation circuit 250, the gate terminal of the third field-effect transistor 275 is coupled to the control input 200d of the high-side switch 200, so that the third field-effect transistor 275 is driven in completely conducting manner, given a corresponding signal design of a control signal present at the control signal input 200d. If the load current $I_L$ lies in the range between the two load current values $I_{L0}$ and $I_{L1}$, in which the load path voltage $V_{DS}$ of the first field-effect transistor 240 is approximately constant due to the gate back regulation circuit 250, an almost constant voltage is present at the external resistor 290 due to the constant drive of the third field-effect transistor 275, so that the load current $I_{OL(ON)}$ is approximately constant also in this load current region and does not substantially depend on the load current $I_L$. By corresponding dimensioning of the external resistor 290 with the resistance $R_{OL}$, the load current value $I_{L0}$, in particular, may thus be determined, from which on the drive voltage $V_{GS}$ of the first field-effect transistor 240 drops below the driving threshold $V_{R1}$ with decreasing load current $I_L$.

If the drive voltage $V_{GS}$ drops below the driving threshold $V_{R1}$, a logic signal with the value High is provided at the output 295c of the comparison circuit 295 and made available to the logic AND gate 300. In the switched-on state of the high-side switch 200, i.e. when a control signal corresponding to a logic High is present at the control signal input 200d of the high-side switch 200, a logic signal with the value High is provided at the output of the AND gate 300 due to the connection of the control signal input 200d to the AND gate 300, so that the first switch circuit 305 interrupts the conducting connection between the first terminal and the second one of the first switch circuit 305. So as to avoid a decrease of the drive voltage $V_{GS}$ to a value below the driving threshold $V_{R1}$, which is caused by a switch-off level of the signal present at the control input 200d of the high-side switch 200, to be wrongfully recognized as a load interruption, the interruption means 130 in the present embodiment comprises an AND gate 300, which combines the control signal present at the control signal input 200d of the high-side switch 200 and the signal at the output of the comparison circuit 295 with each other and thus ensures that the first switch circuit 305 only interrupts the connection between the first terminal and the second terminal of the first switch circuit 305, when a signal with a signal value corresponding to a logic High is present at the control input 200d of the high-side switch.

For generating the intermediate signal, which in the present embodiment is a current $I_{Sense}$, the control means 110 comprises a current-measuring circuit block 335 referred to as "current sense" in FIG. 5, which includes the second field-effect transistor 260, the operational amplifier 265, and the controllable current source 270. The current measuring circuit block 335 here represents a regulating circuit, in which the current $I_{Sense}$ the controllable current source 270 provides is regulated by the operational amplifier 265 so that the load path voltage $V_{DS}$ also drops between the drain terminal and the source terminal of the second field-effect transistor 260. So as to make this possible, the drain terminal of the second field-effect transistor 260 is coupled to the drain terminal of the first field-effect transistor 240 on the one hand, and the gate terminal of the second field-effect transistor 260 to the output 250a of the gate back regulation circuit 250, like the gate terminal of the first field-effect transistor 240.

Due to its connection the operational amplifier 265 serves as a regulating member, which provides that the potential present at the source terminal of the first field-effect transistor 240 also is available at the source terminal of the second field-effect transistor 260. The second field-effect transistor 260 thus represents a "measuring transistor" for the load current $I_L$ or more particularly for the load current portion $I'_L$ flowing through the first field-effect transistor 240. The ratio of the current $I_{Sense}$ provided from the controllable current source 270 as compared to the load current portion $I'_L$ is substantially determined via the area ratio of the second field-effect transistor 260 and the first field-effect transistor 240. The difference between the load current $I_L$ and the load current portion $I'_L$ is substantially determined by the dimensioning of the resistance $R_{OL}$ of the external resistor 290. Its dimensioning thus represents a tradeoff between accuracy of the load current measurement on the one hand and the fixing of the open load threshold current on the other hand.

The influencing means 120 of the high-side switch 200 shown in FIG. 5 serves to set, in the case of an undershoot of the voltage $V_{IS\_min}$ by the voltage $V_{IS}$ present at the third terminal 200c of the high-side switch 200, i.e. the power signal of the high-side switch 200, the same to the voltage value $V_{IS\_min}$ as long as the power signal is not interrupted by the interruption means 130. To this end, the comparator 325 compares the voltage present at the third terminal 200c of the high-side switch 200 to the voltage of the internal voltage source 320. The comparator 325 makes a logic High signal available at its output in case of the undershoot, so that in this case the second switch circuit 315 closes the connection between its first terminal and its second terminal and thus connects the internal voltage source 320 to the node 310. As a result, the voltage $V_{IS\_min}$ is available at the third terminal 200c of the high-side switch 200 as long as the interruption means 130 interrupts the connection between the node point 315 and the third terminal 200c.

In the following, a possible realization of the gate back regulation circuit 250 will be shown and explained on the basis of FIG. 7. The gate back regulation circuit 250 comprises a drive circuit 350 attached to the control input 250d of the gate back regulation circuit 250 with an input. In accordance with the signal present at the control input 250d, the drive circuit 350 provides a drive voltage $V_{GS}$ for the first field-effect transistor 240 at an output 350b connected to the output 250a of the gate back regulation circuit 250. If the signal present at the control input 250d of the gate back regulation circuit 250 assumes the value High, this drive voltage $V_{GS}$ for example corresponds to the voltage $V_{GS0}$ explained on the basis of FIG. 6. If the signal present at the control input 250d of the gate back regulation circuit 250 assumes a signal level corresponding to a logic Low, the drive voltage generated by the drive circuit 350 assumes a value lying safely below the employment voltage of the first field-effect transistor 240.

For the regulation of the drive voltage $V_{GS}$ depending on the load path voltage $V_{DS}$, the gate back regulation circuit 250 comprises a regulating arrangement with an internal transistor 360 connected between the output 250a and the source potential terminal 250c of the gate back regulation circuit 250, and embodied as an enhancement n-channel MOSFET in the present embodiment, and an internal operational amplifier 370 driving the internal transistor 360. To this end, an output of the internal operational amplifier 370 is connected to a gate terminal of the internal transistor 360. A drain terminal of the internal transistor 360 is connected to the output 350b of the driver circuit 350, and hence to the output 250a of the gate back regulation circuit 250. A source terminal of the internal transistor 360 is connected to the source potential terminal 250c of the gate back regulation circuit 250. An inverting input of the internal operational amplifier 370 is connected to the drain potential terminal 250b of the gate back regulation circuit 250, and the non-inverting input of the internal operational amplifier 370 to a terminal of a second internal voltage source 380, which lies at a lower potential as opposed to a further terminal of the second internal voltage source 380 by a voltage $V_{R2}$. The second terminal of the second internal voltage source 380 also is connected to the source potential terminal 250c of the gate back regulation circuit 250.

The internal operational amplifier 370 now compares the load path voltage $V_{DS}$ to the voltage $V_{R2}$ provided from the second internal voltage source 380 and drives the internal transistor 360 depending on this comparison result. Due to the connection of the inverting and non-inverting inputs of the internal operational amplifier 370, the voltage present between these two inputs just corresponds to the difference from the load path voltage $V_{DS}$ and the voltage $V_{R2}$. If the load path voltage $V_{DS}$ is greater than the voltage $V_{R2}$, the value of which may for example correspond to the value $V_{DS0}$ from FIG. 6, the internal transistor 360 is blocked, and the drive voltage $V_{GS}$ corresponds to the drive voltage provided from the driver circuit 350. If the load path voltage $V_{DS}$ reaches the value of the voltage $V_{R2}$ at small load currents $I_L$, the internal operational amplifier 370 begins driving the internal transistor 360 in conducting manner, with the aim of regulating the difference between the load path voltage $V_{DS}$ and the voltage $V_{R2}$ to zero. This means that the load path voltage $V_{DS}$ is regulated to the value of the second internal voltage source 380, i.e. to the value $V_{R2}$.

This regulation ends with decreasing load current $I_L$, when the internal transistor 360 is opened so far that the drive voltage $V_{GS}$ drops below the value of the employment voltage of the first field-effect transistor 240, or when the interruption means 130 is activated previously due to the drive voltage $V_{GS}$ falling below the value $V_{R1}$. In the first case, the first field-effect transistor 240 blocks completely, so that the load current portion $I'_L$ as well as the load path voltage $V_{DS}$ drop to a value close to zero.

Figure 8:
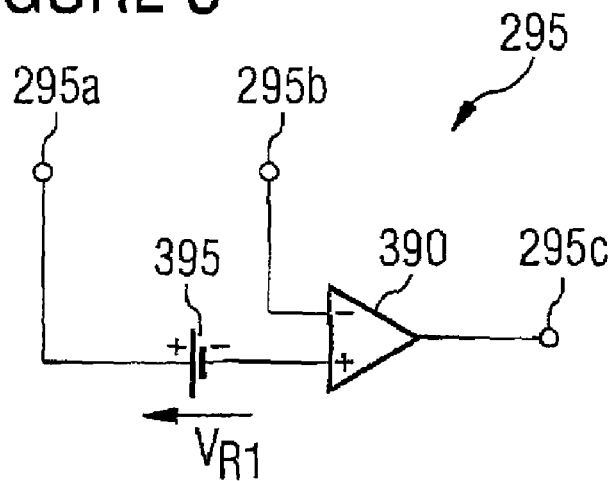
FIG. 8 is a circuit diagram of a possible realization of a comparison circuit.

FIG. 8 shows a possible embodiment of the comparison circuit 295. The comparison circuit 295 comprises an internal comparator 390 having an output attached at the output 295c of the comparison circuit 295, and an inverting input connected to the second input 295b of the comparison circuit 295. The first input 295a of the comparison circuit 295 is coupled to a terminal of the third internal voltage source 395, which lies at a higher potential as opposed to the second terminal of the third internal voltage source 395 by the voltage $V_{R1}$. The second terminal of the third internal voltage source 395 is connected to a non-inverting input of the internal comparator 390. Due to the inclusion of the comparison circuit 295 in the high-side switch 200, the internal construction of the comparison circuit 295 leads to the internal comparator 390 providing a logic High signal at the output 295c, when the drive voltage $V_{GS}$ present at the second input 295b of the comparison circuit 295 drops below the voltage $V_{R1}$ as opposed to the source potential of the first field-effect transistor 240 supplied to the first terminal 295a of the comparison circuit 295. If the drive voltage $V_{GS}$ lies above the voltage $V_{R1}$ of the third internal voltage source 395, a logic Low signal is present at the output 295c of the comparison circuit 295.

In other words, FIG. 5 shows an exemplary circuit-technology implementation for a high-side switch, for example a Profet® with ground reference, also referred to as voltage-controlled Profet®. The circuit blocks illustrated show the gate back regulation circuit 250, wherein FIG. 7 shows a possible realization of this circuit, the current measuring circuit block 335 (current sense), the open load activation circuit block 330 (open load recognition when ON), the influencing means 120 for "clamping" the sense signal at low load currents or "clamping" the sense voltage, and the interruption means 130 for outputting a defined signal in the case of the load interruption (open load), wherein the defined signal may for example be characterized by a "zero current". The functionality and the more detailed description are included in the above sections of the present application.

In other words, FIG. 5 shows a circuit example for a high-side switch with open load recognition in the switched-on state (ON) and a sense functionality with "clamping" the sense voltage from a minimum sense voltage $I_{IS\_min}$ on. The open load recognition when ON is implemented here according to the unpublished German patent application DE 10 2005 030 150.9 or according to the description in the preceding sections of the present application, wherein the open load threshold in this example may be adjusted via the external resistor 290 with the resistance R_OL. In this example, the open load recognition is activated on switch-on the high-side switch 200. Basically, separate activation with or without external adjustment of the open load threshold may also be implemented. The current measuring circuit block 335 (sense block) first is designed comparably to a corresponding sense block of a present-day high-side switch without open load recognition during ON.

In still other words, FIG. 5 shows a smart semiconductor switch 200 with extended current sense functionality for open load detection in the switched-on state.

The signal design of the sense voltage for the discrimination between the operation states of open load as opposed to the normal operation (normal load) is achieved by an additional internal voltage source 320 connected via the second switch circuit 315. If the switch 200 is imparted—independently of an activated or deactivated gate back regulation—with too small a load current $I_L$, which would lead to too small a voltage drop at the sense resistor or measuring resistor 207 via the $K_{ILIS}$ dividing ratio and the resistance $R_{IS}$ of the measuring resistor 207, the second switch circuit 315 is closed via the comparator 325 so that the voltage is "clamped" to a defined value at the sense resistor or measuring resistor 207. This defined value of the voltage $V_{IS\_min}$ is provided by the internal voltage source 320. If the load current $I_L$ falls below the open load threshold $I_{L(ON\_ON)}$, for example, by the open load recognition during ON, the third terminal 200c or sense output of the high-side switch 200 is deactivated via the first switch circuit 305 or via a transistor. The voltage across the sense resistor 207 thus drops to zero from the previous value $V_{IS\_min}$.

Figure 9:
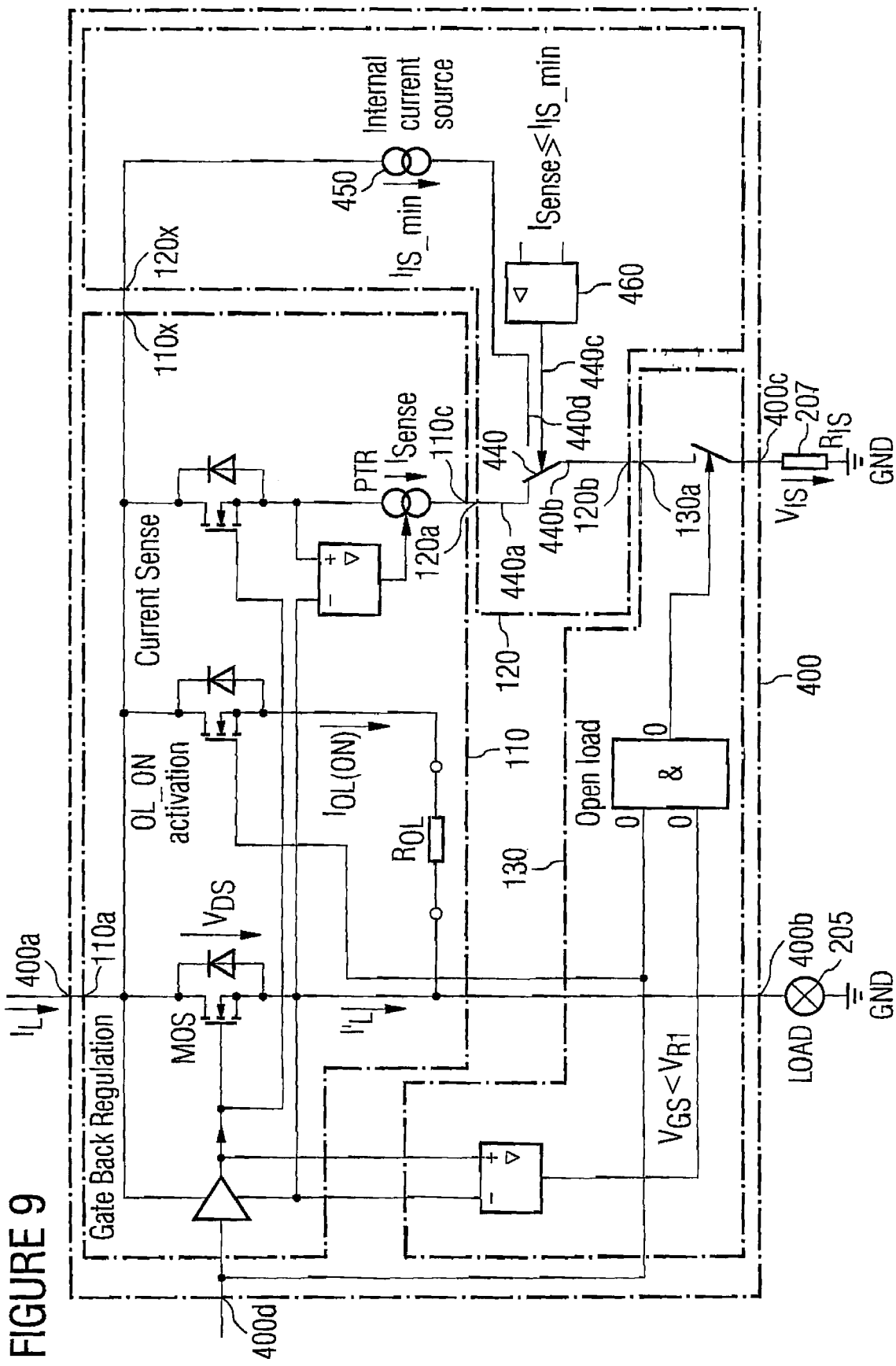
FIG. 9 is a schematic block circuit diagram of a second embodiment.

FIG. 9 shows a schematic block diagram of a further embodiment of an apparatus for generating a power signal from a load current in form of a high-side switch 400. Just like the high-side switch 200 shown in FIG. 5, the high-side switch 400 comprises a first terminal 400a for a load current $I_L$, a second terminal 400b for the load current $I_L$, a third terminal 400c for the power signal, which again is a voltage signal $V_{IS}$ in the present case, and a control input 400d. The high-side switch 400 is connected, with its second terminal 400b, to a load 205 and further to a reference potential GND. Just like the high-side switch 200 from FIG. 5, the high-side switch 400 also is connected, at its third terminal 400c, to a measuring resistor 207 with a resistance $R_{IS}$, across which the power signal $V_{IS}$ drops, and further to the reference potential GND. Just like the high-side switch 200 from FIG. 5, the high-side switch 400 comprises a control means 110, an influencing means 120, and an interruption means 130.

The interruption means 130 of the high-side switch 400 does not differ from the interruption means 130 of the high-side switch 200, so that reference is made to the corresponding sections further above in the present application for the description of the construction and the functioning. The control means 110 of the high-side switch 400 only differs from the control means 110 of the high-side switch 200 in that it comprises a further terminal 110x directly connected to the load current input 110a. Apart from the further terminal 110x, the control means 110 of the high-side switch 400 does not differ from the control means 110 of the high-side switch 200 shown in FIG. 5, so that reference also is made to the corresponding sections further above for the description of the further construction and the functioning.

Only with reference to the influencing means 120 does the high-side switch 400 have substantial differences as opposed to the high-side switch 200 from FIG. 5. The influencing means 120 of the high-side switch 400 also comprises an intermediate signal input 120a connected to the intermediate signal output 110c, as well as a power signal output 120b connected to the interruption input 130a of the interruption means 130. In contrast to the influencing means 120 of the high-side switch 200 from FIG. 4, the influencing means 120 of the high-side switch 400 comprises a further terminal 120x connected to the further terminal 110x of the control means 110.

The influencing means 120 of the high-side switch 400 comprises a changeover switch circuit 440 having a first terminal 440a connected to the intermediate signal input 120a, a second terminal 440b connected to the power signal output 120b, a control input 440c, and a third terminal 440d. The third terminal 440d of the changeover switch circuit 440 is coupled to a first terminal of an internal current source 450, which is attached, with a second terminal, to the further terminal 120x of the influencing means 120. The internal current source 450 here provides a current with a value of $I_{IS\_min}$ at its terminals. The control input 440c of the changeover switch circuit 440 is connected to an output of a current comparison circuit 460.

Here, the current comparison circuit 460 and the changeover switch circuit 440 are designed so that the second terminal 440b of the changeover switch circuit 440 is connected to the first terminal 440a of the changeover switch circuit 400 in electrically conducting manner, if the current value $I_{Sense}$ of the intermediate signal, which the control means 110 provides at the intermediate signal output 110c, is greater than the current $I_{IS\_min}$ provided from the internal current source 450. If this is not satisfied, i.e. $I_{Sense} < I_{IS\_min}$ applies, the current comparison circuit 460 and the changeover switch circuit 440 are designed so that in this case the second terminal 440b is connected to the third terminal 440d of the changeover switch circuit 440 in electrically conducting manner.

Figure 10:
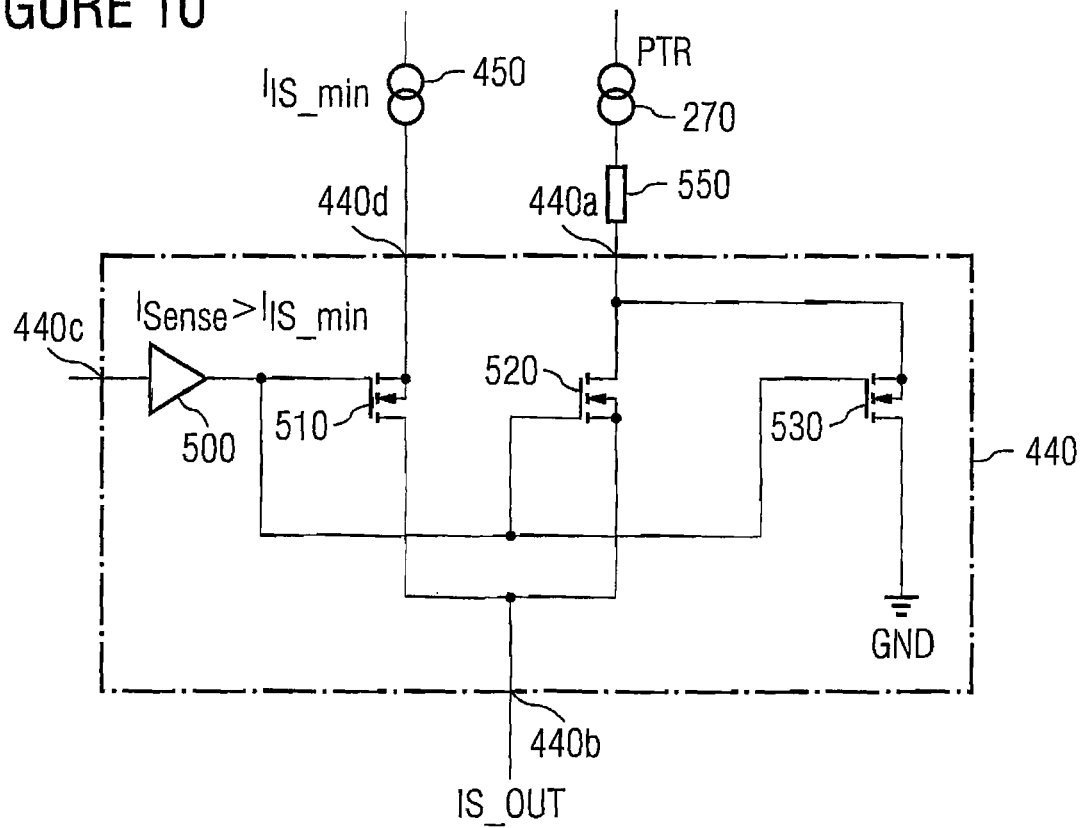
FIG. 10 is a circuit diagram of a possible realization of changeover switching means.

FIG. 10 shows an embodiment of a changeover switch circuit 440 and its inclusion in the embodiment from FIG. 9. The changeover switch circuit 440 comprises a further driver circuit 500 having an input and an output, the input of the further driver circuit 500 being connected to the control input 440c of the changeover switch circuit 440. Moreover, the changeover switch circuit 440 comprises a first switching transistor 510, a second switching transistor 520, and a third switching transistor 530, which are embodied as enhancement MOSFETs in the present embodiment. Here, the first switching transistor 510 and the third switching transistor 530 are implemented as enhancement p-channel MOSFETs, and the second switching transistor 520 as an enhancement n-channel MOSFET. All three switching transistors 510, 520, 530 are attached to the output of the further driver circuit 500 with a gate terminal.

The first terminal 440a of the changeover switch circuit 440 is connected to both a drain terminal of the second switching transistor 520 and a source terminal of the third switching transistor 530. The second terminal 440b, however, is connected to a source terminal of the second switching transistor 520 and a drain terminal of the first switching transistor. A drain terminal of the third switching transistor 530 is connected to the reference potential GND, whereas a source terminal of the first switching transistor 510 is coupled to the fourth terminal 440d of the changeover switch circuit 440. The first terminal 440a of the changeover switch circuit 440 is connected to the controllable current source 270 of the control means 110 via a further measuring resistor 550. As this is already shown in FIG. 9, the third terminal 440d of the changeover switch circuit 440 is connected to the internal current source 450.

Depending on the signal provided to the further driver circuit 500 at its input, the same generates, at its output, a signal designed so that either the first switching transistor 510 and the third switching transistor 530 block completely and the second switching transistor 510 is gated through completely, or that the first switching transistor 510 and the third switching transistor 530 are gated through completely and the second switching transistor 520 is blocked completely. Hereby, depending on the signal present at the control input 440c of the changeover switch circuit 440, a current IS_OUT supplied to the changeover switch circuit 440 either at its first terminal 440a or at its third terminal 440d can be tapped at the second terminal 440b.

Figure 11A:
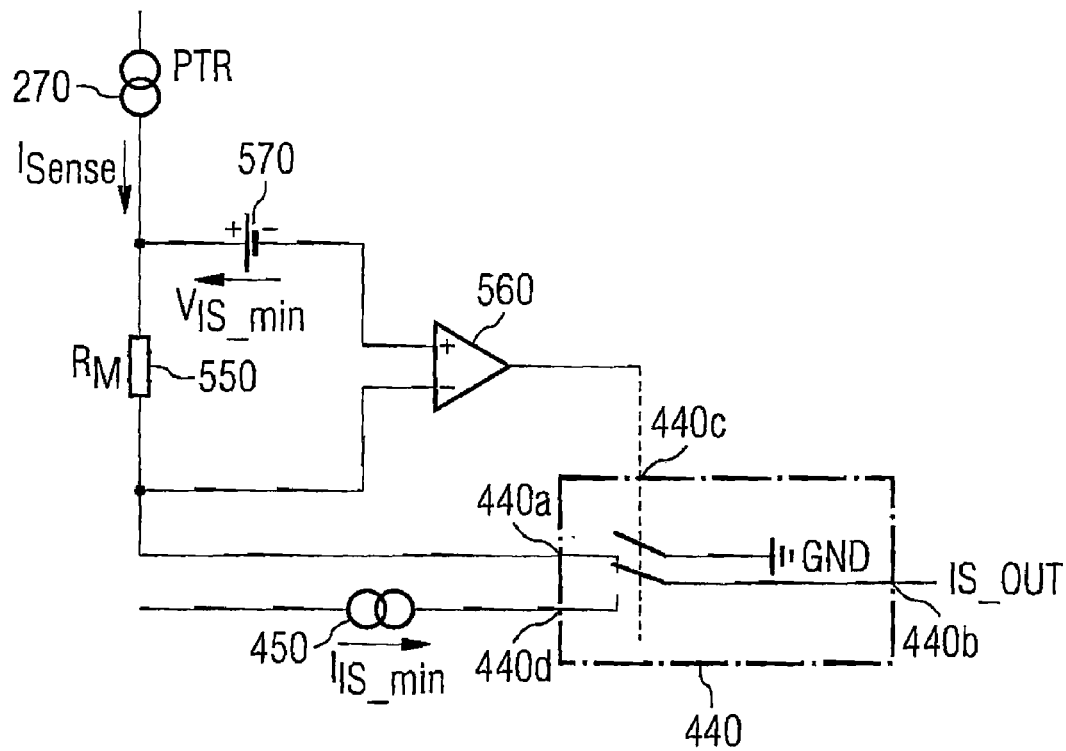
FIG. 11 is a circuit diagram of a possible realization of a current comparison circuit and of two schematic functional circuit diagrams.
Figure 11B:
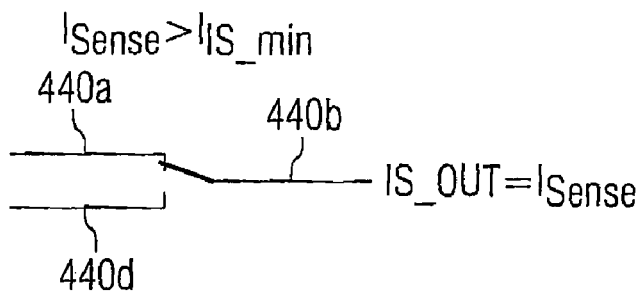
Figure 11C:
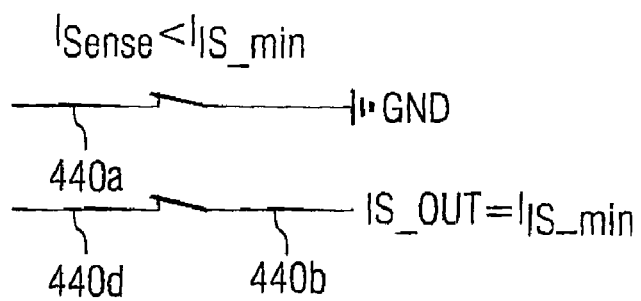
Figure 12A:
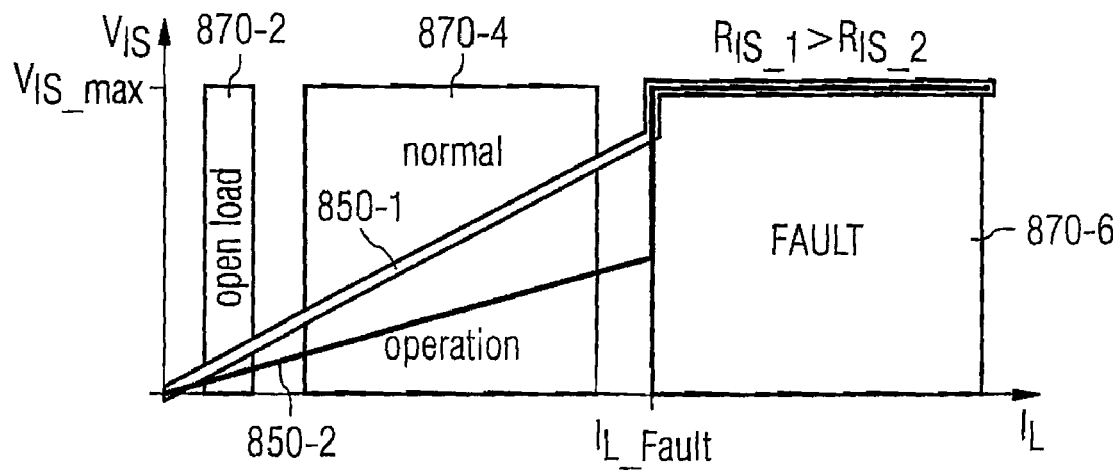
FIG. 12 shows two schematic illustrations of the waveform of a power signal according to a possible solution.
Figure 12B:
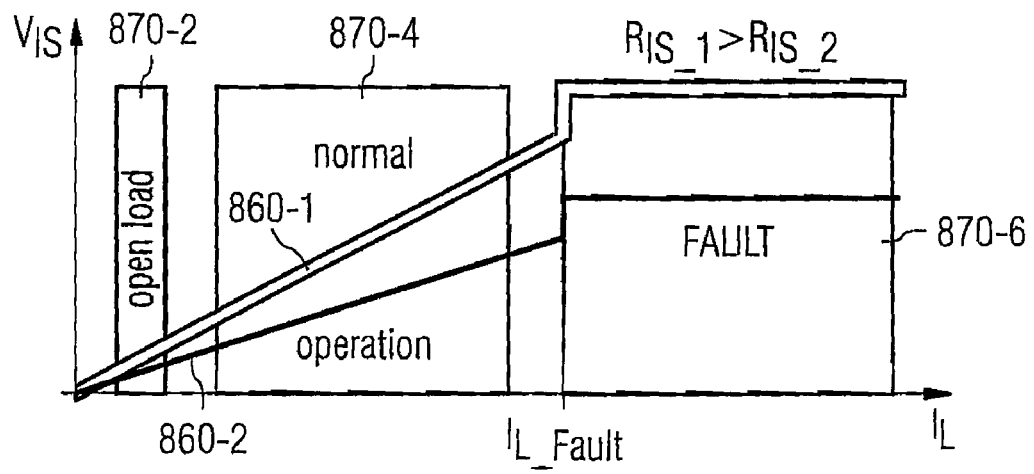

FIG. 11 shows a possible embodiment of a current comparison circuit 460. Here, FIG. 11a shows the circuit diagram of a possible realization, whereas FIGS. 11b and 11c each show, in form of a mechanical analogon, the case of the intermediate signal $I_{Sense}$ exceeding (FIG. 11b) and not exceeding (FIG. 11c), respectively, the current $I_{IS\_min}$ made available from the internal current source 450. Here, FIG. 11a also shows a simplified mechanical analogon for the changeover switch circuit 440. The current comparison circuit 460 also comprises a comparison comparator 560 and a reference voltage source 570, apart from the further measuring resistor 550. Here, an output of the comparison comparator 560 is coupled to the control input 440c of the changeover switch circuit 440. An inverting input of the comparison comparator 560 is connected to the first terminal 440a of the changeover switch circuit 440 on the one hand and a terminal of the further measuring resistor 550. A non-inverting input of the comparison comparator 560 is connected to a terminal of the reference voltage source 570, which has a reduced potential as opposed to a further terminal of the reference voltage source 570 by a voltage magnitude $V_{IS\_min}$. The further terminal of the reference voltage source 570 is connected to a further terminal of the further measuring resistor 550 and the controllable current source 270, which provides the intermediate signal of the current strength $I_{Sense}$. As this has already been shown in FIG. 9, the internal current source 550 is connected to the third terminal 440d of the changeover switch circuit 440.

In the embodiment shown in FIG. 11a, the comparison of the currents $I_{Sense}$ and the current $V_{IS\_min}$ is realized via the reference voltage source 570 and the further measuring resistor 550, which has a resistance $R_M$. In this embodiment, the voltage $V_{IS\_min}$ of the reference voltage source 570 and the current $I_{IS\_min}$ of the internal current source 450 satisfy the relation $$V_{IS\_min} = R_M \cdot I_{IS\_min}.$$

In case of the current $I_{Sense}$ being greater than the current $I_{IS\_min}$ which is also schematically shown in FIG. 11b, the voltage drop across the further measuring resistor 550 exceeds the voltage of the reference voltage source 570, so that the comparison comparator 560 in this case outputs a logic High signal to the control input 440c of the changeover switch circuit 440. In this case, as shown in FIG. 11b, the first terminal 440a and the second terminal 440b of the changeover switch circuit 440 are conductively connected to each other, so that the output current IS_OUT=$I_{Sense}$ is available at the second terminal 440b. But if the current $I_{Sense}$ is smaller than the current $I_{IS\_min}$, the voltage of the reference voltage source 570 is greater than the voltage drop across the further measuring resistor 550, so that the comparison comparator 560 makes a logic Low signal available to the control input 440c of the changeover switch circuit. In this case, which is schematically shown in FIG. 11c, the first terminal 440a of the changeover switch circuit 440 is connected to the reference potential GND, and the third terminal 440d to the second terminal 440b of the changeover switch circuit 440, so that an output current IS_OUT=$I_{IS\_min}$ is available at the second terminal 440b.

In other words, FIG. 9 in connection with FIGS. 10 and 11 shows a circuit example for a high-side switch 400 with open load recognition during ON and a sense functionality with "clamping" the sense current from a minimum sense current $I_{IS\_min}$ on. The exemplary, circuit-technology implementation for a high-side switch 400 with "clamping" the sense current from a minimum sense current on, which is shown in FIG. 9, is particularly suited for high-side switches without ground (current-controlled switch). Basically, this approach is, however, also suited for switches with ground reference. The signal design of the sense current for the discrimination of the case of a load interruption (open load) as opposed to the case of the normal operation (normal load) is achieved by an additional internal current source 450 connected via the changeover switch circuit 440. If the switch 400—independently of an activated or deactivated gate back regulation—is imparted with too small a load current $I_L$, in which the sense current $I_{Sense}$ would be smaller than the current of the internal current source 450 $I_{IS\_min}$, the defined sense current $I_{IS\_min}$ is output via the changeover switch circuit 440 or switch 440, so that the voltage at the sense resistor or measuring resistor 207 is "clamped" to a defined value. If the load current $I_L$ falls below the open load threshold $I_{L(OL\_ON)}$, for example by the open load recognition during ON, the sense output or third terminal 400c of the high-side switch 400 is deactivated via the first switch circuit 305 of the interruption means 130 or via a transistor. The voltage across the sense resistor or across the measuring resistor 207 thus drops to zero in the open load case from the previous value $V_{IS\_min}$, caused by the current $I_{IS\_min}$.

Although the embodiments shown within the scope of this application have only shown high-side switches, an apparatus for generating a power signal from a load current according to the invention is not limited to a high-side switch. Rather, it is also possible to design a corresponding apparatus according to the invention as a low-side switch. Moreover, it is also possible, as the waveforms in FIGS. 2, 3, and 4 have already indicated, to implement setting the power signal to a constant value not only depending on the intermediate signal, but it is rather also possible to use the load current $I_L$ for this directly.

Figure 7:
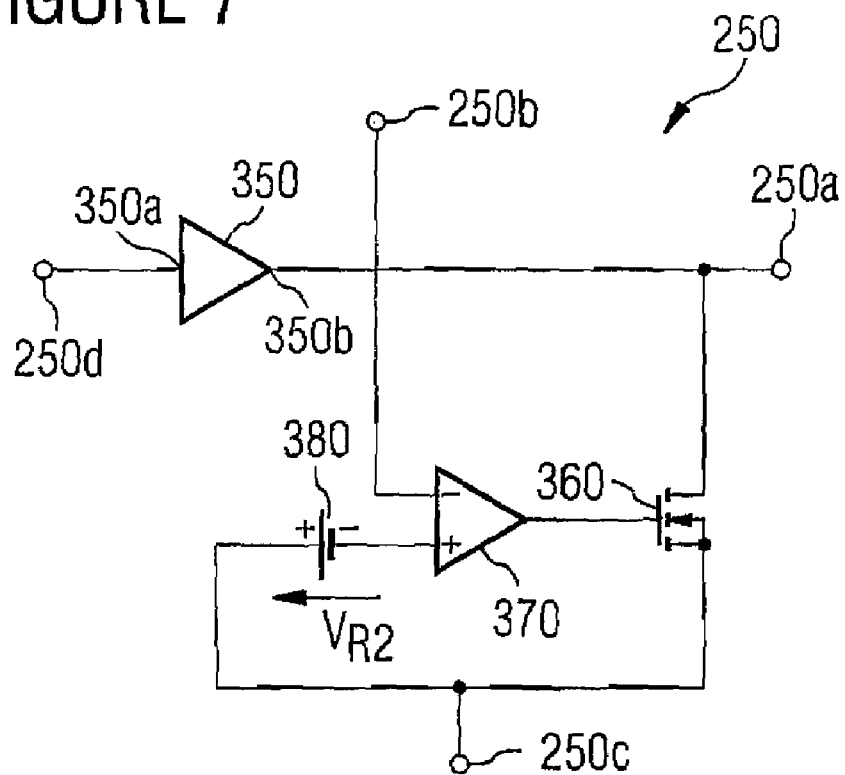
FIG. 7 is a circuit diagram of a possible realization of a gate back regulation circuit.

As the two embodiments in FIG. 5 and FIG. 9 have shown together with the further detail implementations in FIGS. 7 and 8 as well as in FIGS. 10 and 11, it is possible to use both currents and voltages as a basis for a load interruption.

Apart from the current comparison circuit shown in FIG. 11, which makes use of a voltage drop across a resistor for determining a current, it is absolutely possible to employ other current comparison circuits. One example for this is a circuit overlaying the magnetic field of two currents with opposite signs and detecting the resulting magnetic field. For example, Hall probes or other magnetoresistive devices may be employed for this.

Moreover, it is possible to switch in the load interruption recognition (open load recognition) also via a separate activation, in contrast to the embodiments shown in FIGS. 5 and 9. Furthermore, the open load threshold may be set not only via an external resistor, but it is absolutely possible to realize such an open load threshold via a current source or a voltage source, for example.

In other words, the functionality of a "clamped" sense current up to a minimum load current may for example be realized with an embodiment comparable to the one shown in FIG. 9. A corresponding circuit only differs with respect to the comparator signals of the comparators driving the changeover switch circuits, or the signals of the current comparison circuits. In this case, these comparators compare the load current to the criterion $I_L < I_{max\_L(IS)}$ instead of the condition $I_{Sense} < I_{IS\_min}$. The signal design of the current measuring circuit block or current sense described here may also be applied to low-side switches.

Depending on conditions, the method for generating a power signal from a load current flowing through an external apparatus may be implemented in hardware or in software. The implementation may be on a digital storage medium, particularly a floppy disk, a CD or a DVD with electronically readable control signals capable of interacting with a programmable computer system so that the corresponding method is executed. The invention may thus consist in a computer program product with a program code stored on a machine-readable carrier for performing the method, when the computer program product is executed on a computer. In other words, the invention may thus be realized as a computer program with a program code for performing the method, when the computer program is executed on a computer.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. An apparatus for generating a power signal from a load current flowing through an external apparatus, comprising:
   a controller with a load current input for the load current, a load current output for the load current, an intermediate signal output for an intermediate signal, and a status signal output for a status signal;
   an influencer with an intermediate signal input for the intermediate signal and a power signal output for the power signal; and
   an interrupter with an interruption input for the power signal, an interruption output for the power signal, and a status signal input for the status signal,
   wherein the controller is formed to generate the status signal and the intermediate signal, depending on the load current;
   wherein the interrupter is formed to interrupt the power signal if the status signal satisfies a predetermined first condition, and otherwise let the power signal pass; and
   wherein the influencer is formed to output the intermediate signal as the power signal at the power signal output if the intermediate signal does not satisfy a predetermined second condition, and otherwise generate and output the power signal with a predetermined value,
   or is formed so as to output the intermediate signal as the power signal at the power signal output if the load current does not satisfy a predetermined second condition, and otherwise generate and output the power signal with the predetermined value.

2. The apparatus of claim 1, wherein the influencer is formed so that the predetermined value is greater than zero and smaller than a maximum value of the power signal.

3. The apparatus of claim 1, wherein the controller, the influencer, and the interrupter are formed so that the intermediate signal or the load current satisfies the second condition if the status signal satisfies the first condition.

4. The apparatus of claim 1, wherein the controller, the influencer, and the interrupter are formed so that a first load current region in which the status signal satisfies the first condition and the intermediate signal or the load current satisfies the second condition borders on a second load current region in which the intermediate signal or the load current satisfies the second condition and the status signal does not satisfy the first condition, and in which a third load current region in which the intermediate signal or the load current does not satisfy the second condition and the status signal does not satisfy the first condition borders on the second load current region.

5. The apparatus of claim 4, wherein the controller, the influencer, and the interrupter are designed so that the first load current region borders on the second load current region, and the second load current region on the third load current region, with a load current increasing in magnitude.

6. The apparatus of claim 1, wherein the influencer is formed so that the second condition includes a condition on a current strength value of the intermediate signal.

7. The apparatus of claim 1, wherein the influencer is formed so that the second condition includes a condition on a voltage value of the intermediate signal.

8. The apparatus of claim 1, wherein the influencer is formed so that the second condition includes a condition on a current value of the load current.

9. The apparatus of claim 1, wherein the influencer comprises a comparator, a switch, and a signal source.

10. The apparatus of claim 9, wherein the switch comprises a first switching transistor with a control input and a first terminal and a second terminal, and a second switching transistor with a control input and a first terminal and a second terminal, wherein the first switching transistor is coupled to the signal source with the first terminal, the second switching transistor to the intermediate signal input with the first terminal, the second terminal of the first switching transistor to the power signal output with the second terminal of the second control transistor, and the control input of the first switching transistor and the control input of the second switching transistor to the comparator.

11. The apparatus of claim 10, wherein the first switching transistor and the second switching transistor are driven such that the first switching transistor blocks when the second switching transistor gates through, and that the first switching transistor gates through when the second switching transistor blocks.

12. The apparatus of claim 10, wherein the first switching transistor and the second switching transistor are formed as field-effect transistors, wherein the control terminal of the first switching transistor is a gate terminal and the control terminal of the second switching transistor is a gate terminal.

13. The apparatus of claim 12, wherein the first switching transistor is formed as an enhancement p MOSFET, and the second switching transistor as an enhancement n MOSFET, wherein the first terminal of the first switching transistor is a source terminal, the second terminal of the first switching transistor a drain terminal, the first terminal of the second switching transistor a drain terminal, and the second terminal of the second switching transistor a source terminal.

14. The apparatus of claim 9, wherein the switch comprises a first switching transistor with a control input and a first terminal and a second terminal, wherein the control terminal is coupled to the comparator, the first terminal of the first switching transistor to the power signal output, and the second terminal of the first switching transistor to the signal source.

15. The apparatus of claim 1, wherein the controller comprises a high-power field-effect transistor with a source terminal and a drain terminal, wherein the load current passes the source terminal and the drain terminal of the high-power field-effect transistor.

16. The apparatus of claim 1, wherein the interrupter comprises a further comparator with an input and an output and a further switch with a control input and a first terminal and a second terminal, wherein the input of the further comparison circuit is connected to the status signal input, the first terminal of the further switch to the interruption input, and the second terminal of the further switch to the interruption output, and the output of the further comparison circuit is coupled to the control input of the further switch.

17. The apparatus of claim 16, wherein the further switch comprises a further switching transistor, wherein the further switching transistor is coupled to an output of the further comparator with a control input.

18. A method for generating a power signal from a load current flowing through an external apparatus, comprising:
    generating a status signal and an intermediate signal, depending on the load current;
    outputting the intermediate signal as the power signal if the intermediate signal does not satisfy a predetermined second condition, otherwise generating and outputting the power signal with a predetermined value, or outputting the intermediate signal as the power signal if the load current does not satisfy a predetermined second condition, otherwise generating and outputting the power signal with a predetermined value; and
    interrupting the power signal if the status signal satisfies a predetermined first condition, and otherwise letting the power signal pass.

19. The method of claim 18, wherein the predetermined value is greater than zero and smaller than a maximum value of the power signal.

20. The method of claim 18, wherein the intermediate signal or the load current satisfies the second condition if the status signal satisfies the first condition.

21. The method of claim 18, wherein a first load current region in which the status signal satisfies the first condition and the intermediate signal or the load current satisfies the second condition borders on a second load current region in which the intermediate signal or the load current satisfies the second condition and the status signal does not satisfy the first condition, and in which a third load current region in which the intermediate signal or the load current does not satisfy the second condition and the status signal does not satisfy the first condition borders on the second load current region.

22. The method of claim 21, wherein the first load current region borders on the second load current region, and the second load current region on the third load current region, with a load current increasing in magnitude.

23. A computer readable medium comprising a program code for performing, when the code is executed on a computer, a method for generating a power signal from a load current flowing through an external apparatus, comprising:
    generating a status signal and an intermediate signal, depending on the load current;
    outputting the intermediate signal as the power signal if the intermediate signal does not satisfy a predetermined second condition, otherwise generating and outputting the power signal with a predetermined value, or outputting the intermediate signal as the power signal if the load current does not satisfy a predetermined second condition, otherwise generating and outputting the power signal with a predetermined value; and
    interrupting the power signal if the status signal satisfies a predetermined first condition, and otherwise letting the power signal pass.

* * * * *